(12) United States Patent
van der Sijde et al.

(10) Patent No.: US 11,489,005 B2
(45) Date of Patent: Nov. 1, 2022

(54) SEGMENTED LED ARRAYS WITH DIFFUSING ELEMENTS

(71) Applicant: Lumileds LLC, San Jose, CA (US)

(72) Inventors: Arjen van der Sijde, Eindhoven (NL); Nicola Bettina Pfeffer, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 293 days.

(21) Appl. No.: 16/713,045

(22) Filed: Dec. 13, 2019

(65) Prior Publication Data

US 2021/0183940 A1 Jun. 17, 2021

(51) Int. Cl.
*H01L 27/15* (2006.01)
*F21K 9/66* (2016.01)
*H01L 33/20* (2010.01)
*F21Y 115/10* (2016.01)

(52) U.S. Cl.
CPC .............. *H01L 27/156* (2013.01); *F21K 9/66* (2016.08); *H01L 33/20* (2013.01); *F21Y 2115/10* (2016.08)

(58) Field of Classification Search
None
See application file for complete search history.

(56) References Cited

U.S. PATENT DOCUMENTS

| 8,916,886 | B2 | 12/2014 | Engl et al. |
| 9,461,218 | B2 | 10/2016 | Illek et al. |
| 10,285,236 | B2 | 5/2019 | Nelson et al. |
| 10,340,310 | B2 | 7/2019 | Schrama et al. |
| 2010/0096965 | A1* | 4/2010 | Oyaizu .................... F21V 3/12 313/1 |
| 2012/0161162 | A1 | 6/2012 | Engl et al. |
| 2015/0097198 | A1 | 4/2015 | Illek et al. |

(Continued)

FOREIGN PATENT DOCUMENTS

| EP | 2492577 A2 | 8/2012 |
| EP | 2975655 A1 | 1/2016 |

(Continued)

OTHER PUBLICATIONS

KR200312884Y1, corresponding to international application published under WO 2004/041022 A1.

(Continued)

*Primary Examiner* — Andrew J Coughlin

(57) ABSTRACT

Segmented LED arrays with various diffusing elements are disclosed. An example segmented LED array includes a plurality of LEDs arranged in a plurality of sections where a given section may include one or more LEDs and where each section may be aligned with a different respective optical element such as a lens. Each LED may be a wavelength-converting LED in that it may include a light emitter arrangement and a wavelength-converter structure. In various embodiments, diffusing elements in the form of one or more structures of a diffuser material may be provided over the wavelength-converter structure of one or more LEDs, the one or more structures being in a light path between the wavelength-converter structure and at least one of the plurality of optical elements, and configured to diffuse light emerging from the wavelength-converter structure.

19 Claims, 9 Drawing Sheets

(56) References Cited

U.S. PATENT DOCUMENTS

| | | | |
|---|---|---|---|
| 2015/0338065 A1* | 11/2015 | Wang | F21V 9/30 362/97.1 |
| 2017/0249501 A1 | 8/2017 | Sijde et al. | |
| 2018/0129121 A1 | 5/2018 | Sijde et al. | |
| 2018/0206298 A1 | 7/2018 | Chen | |
| 2019/0159316 A1 | 5/2019 | Pfeffer et al. | |
| 2019/0237935 A1 | 8/2019 | Schrama | |
| 2019/0319019 A1 | 10/2019 | Engelen et al. | |
| 2019/0324350 A1 | 10/2019 | Sijde et al. | |

FOREIGN PATENT DOCUMENTS

| | | |
|---|---|---|
| JP | 2010-034184 A | 2/2010 |
| WO | 03/012884 A1 | 2/2003 |
| WO | 2004/041022 A1 | 5/2004 |
| WO | 2009/158313 A1 | 12/2009 |
| WO | 2010/083929 A1 | 7/2010 |
| WO | 2013/064800 A1 | 5/2013 |
| WO | 2013/135470 A1 | 9/2013 |
| WO | 2019104182 A1 | 5/2019 |

OTHER PUBLICATIONS

From the EPO as the ISA, Notification of Transmittal of the International Search Report and the Written Opinion of the International Searching Authority, or the Declaration, PCT/US2020/064731, dated Mar. 31, 2021, 13 pages.

\* cited by examiner

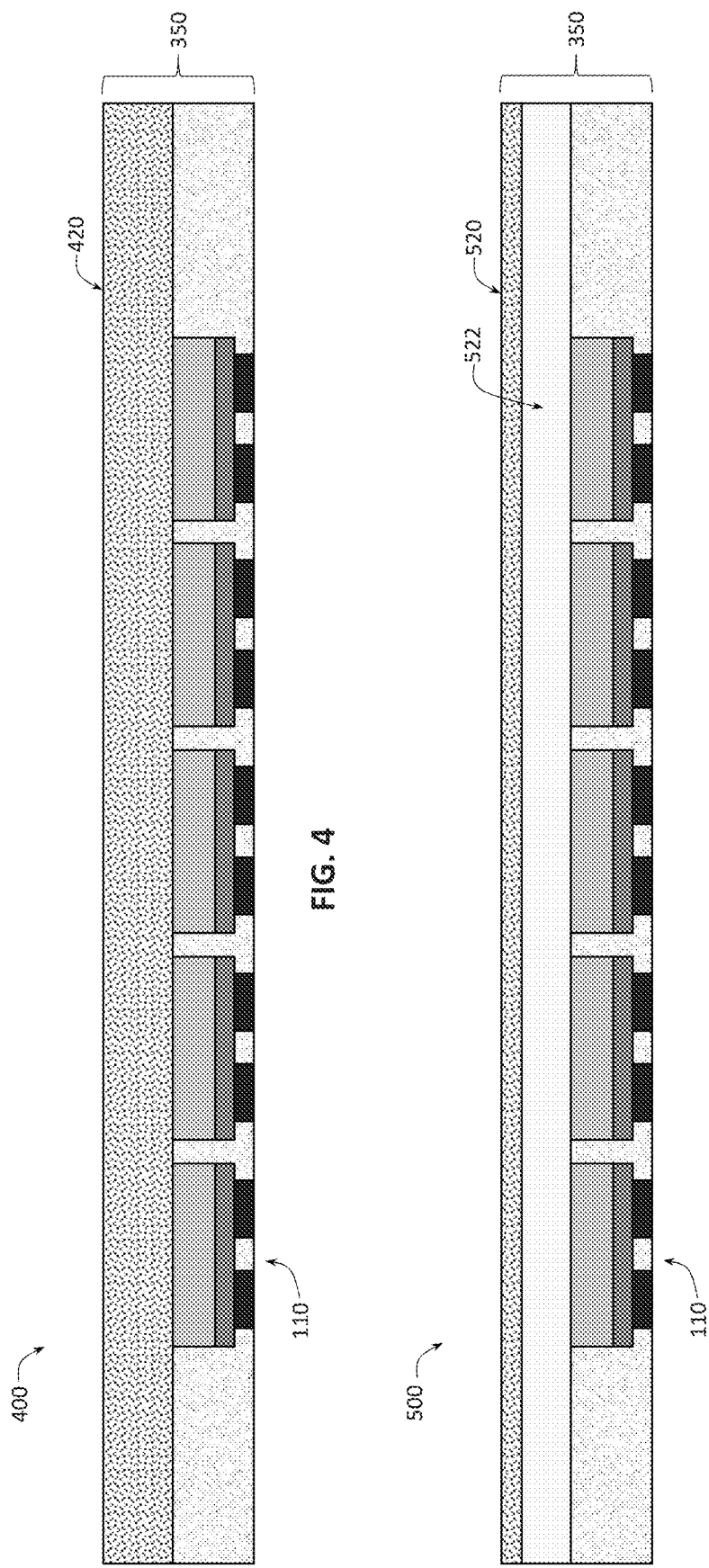

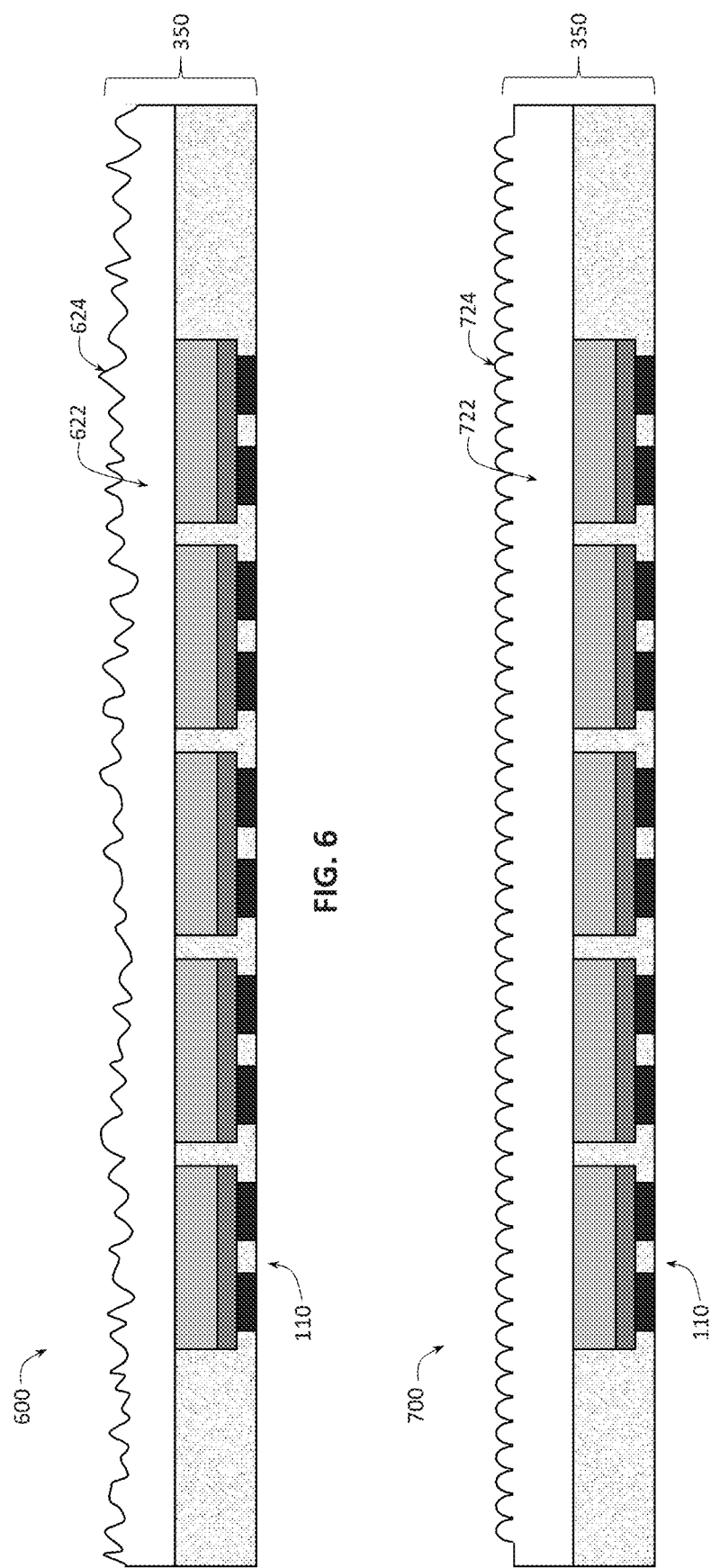

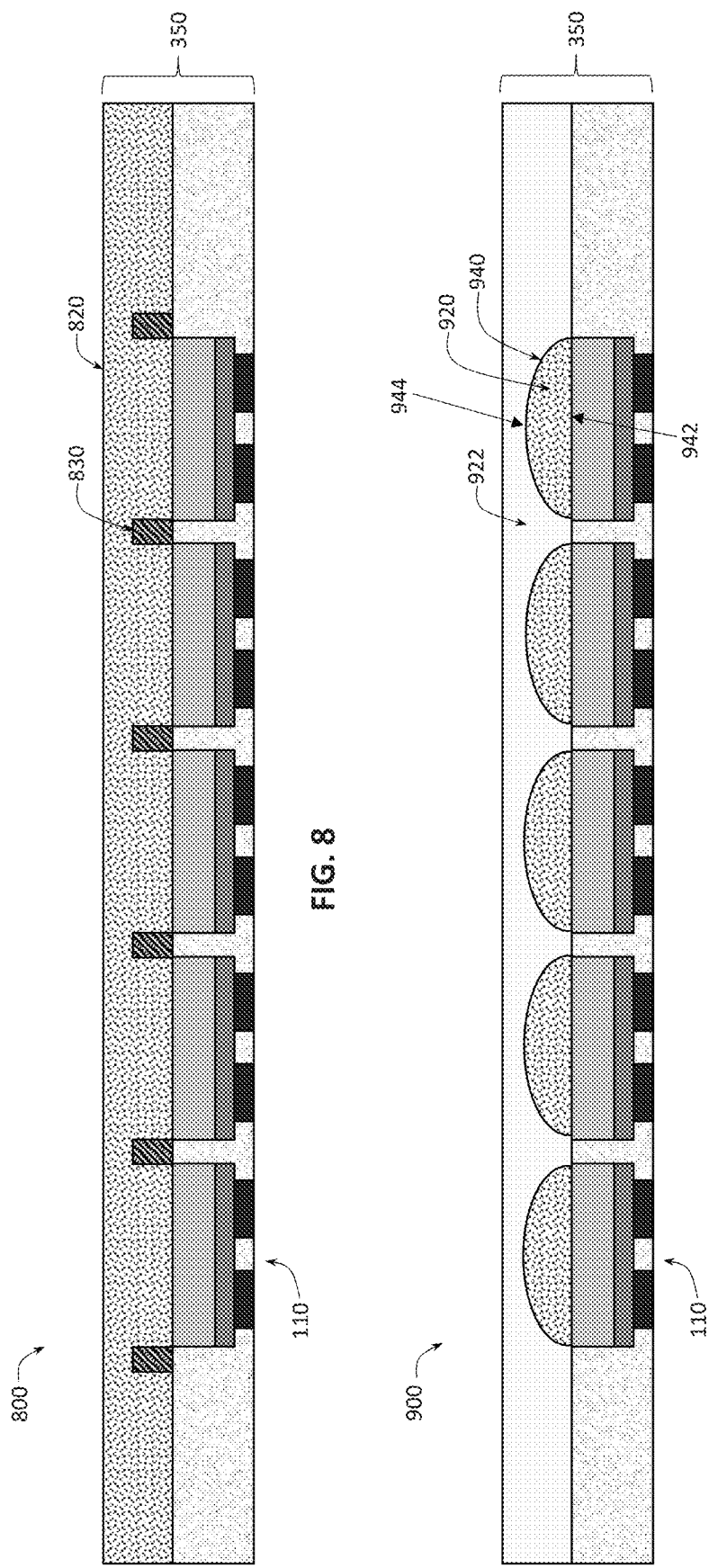

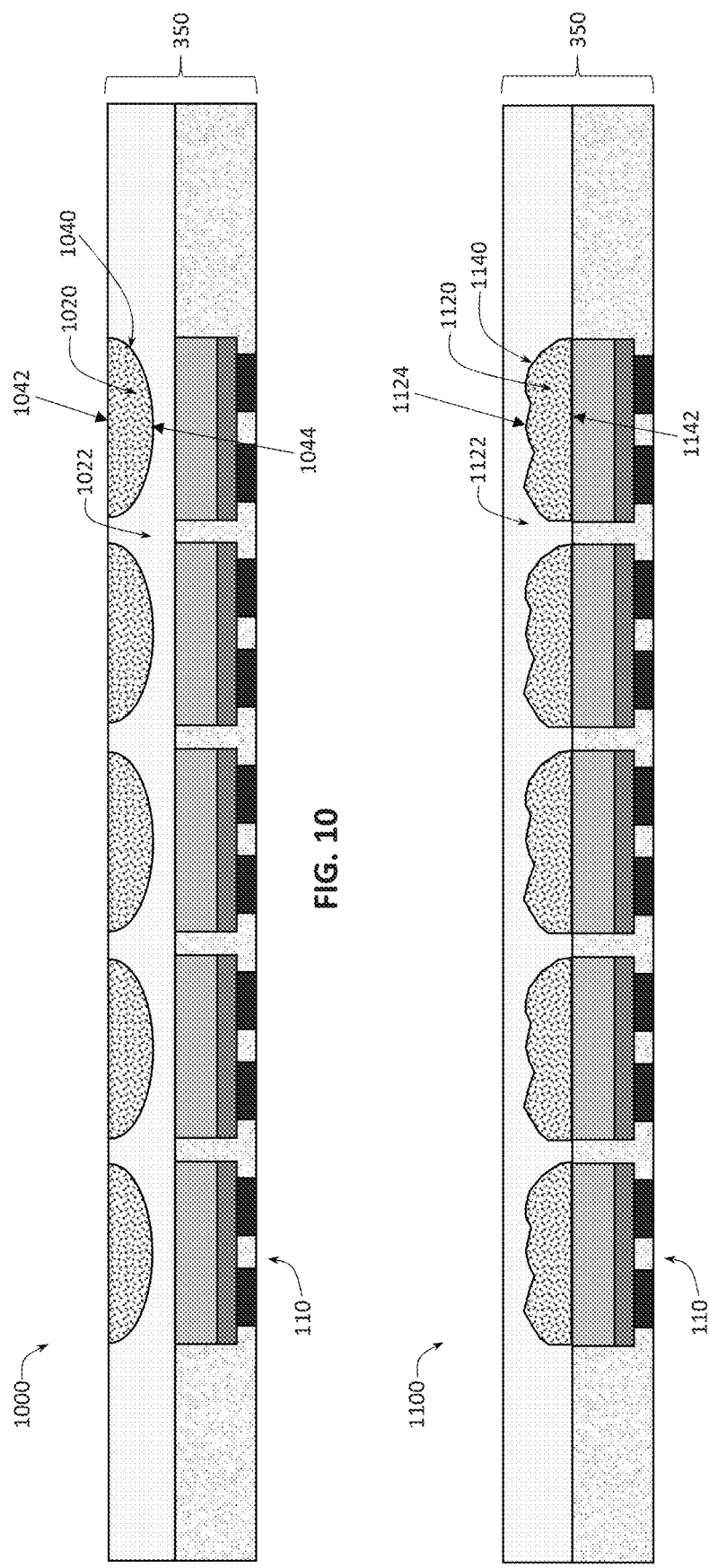

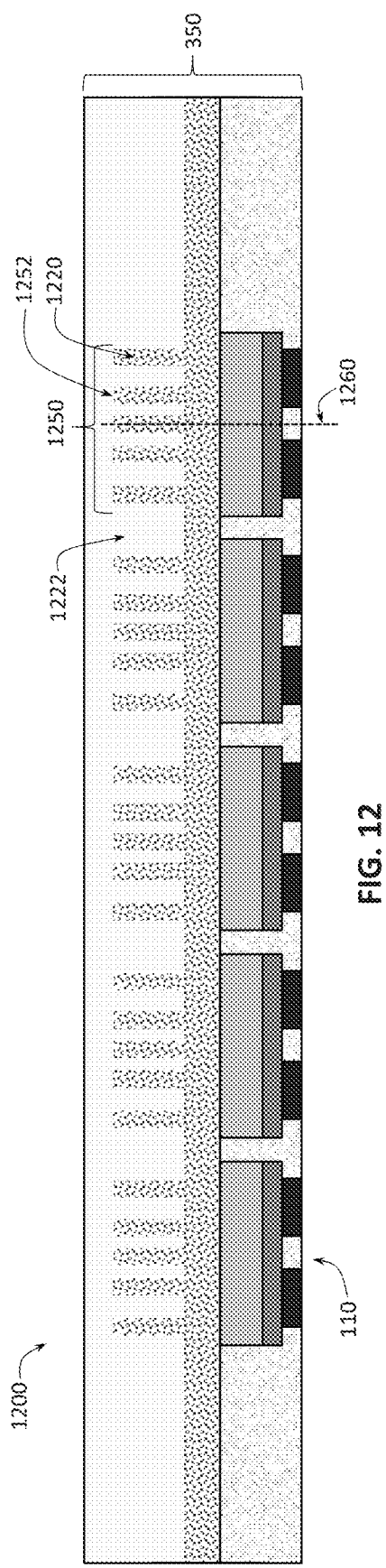
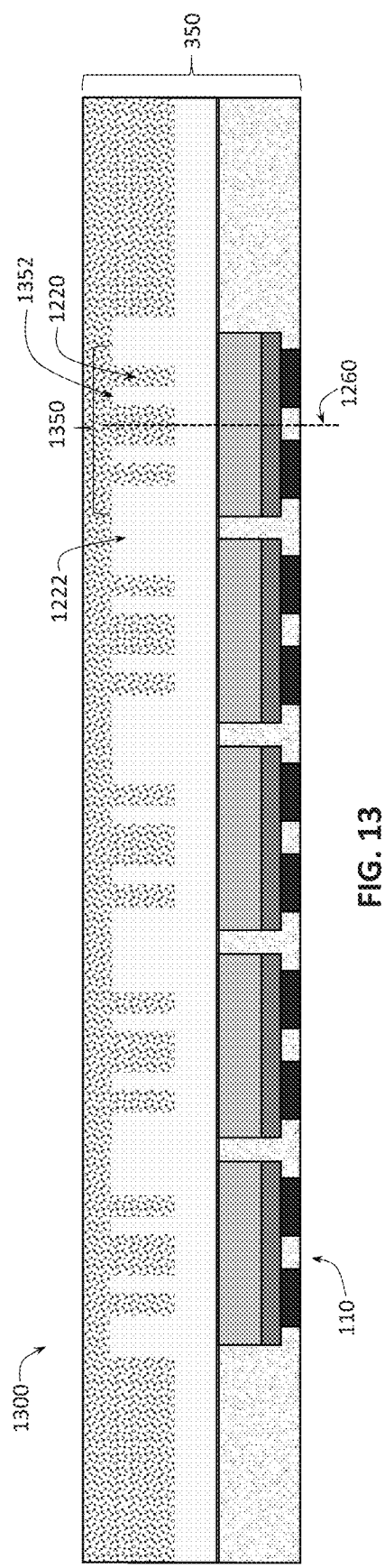
FIG. 12
FIG. 13

SEGMENTED LED ARRAYS WITH DIFFUSING ELEMENTS

TECHNICAL FIELD OF THE DISCLOSURE

The present disclosure relates generally to light emitting diodes (LEDs) and, more specifically, to segmented LED arrays.

BACKGROUND

LEDs are commonly used as light sources in various applications. LEDs can be more energy-efficient than traditional light sources, providing much higher energy conversion efficiency than incandescent lamps and fluorescent light, for example. Furthermore, LEDs typically radiate less heat into illuminated regions and afford a greater breadth of control over brightness, emission color and spectrum than traditional light sources. These characteristics make LEDs an excellent choice for various lighting applications ranging from indoor illumination to automotive lighting.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 4 illustrates a cross-sectional side view of an example LED array with a continuous layer of a diffuser material over a plurality of LEDs, according to some embodiments of the present disclosure;

FIG. 5 illustrates a cross-sectional side view of an example LED array with a continuous layer of a diffuser material over an optically transparent material over a plurality of LEDs, according to some embodiments of the present disclosure;

FIG. 6 illustrates a cross-sectional side view of an example LED array with a continuous layer of an optically transparent material with an irregular rough surface, according to some embodiments of the present disclosure;

FIG. 7 illustrates a cross-sectional side view of an example LED array with a continuous layer of an optically transparent material with periodic shapes at the surface, according to some embodiments of the present disclosure;

FIG. 8 illustrates a cross-sectional side view of an example LED array with a continuous layer of a diffuser material over a plurality of LEDs with partial segmentation, according to some embodiments of the present disclosure;

FIG. 9 illustrates a cross-sectional side view of an example LED array with respective dome-shaped structures of a diffuser material over each of a plurality of LEDs, according to some embodiments of the present disclosure;

FIG. 10 illustrates a cross-sectional side view of an example LED array with respective dome-shaped structures of a diffuser material over each of a plurality of LEDs, according to other embodiments of the present disclosure;

FIG. 11 illustrates a cross-sectional side view of an example LED array with respective dome-shaped structures of a diffuser material with a rough or structured surface over each of a plurality of LEDs, according to some embodiments of the present disclosure;

FIG. 12 illustrates a cross-sectional side view of an example LED array with respective sets of columns of a diffuser material over each of a plurality of LEDs, according to some embodiments of the present disclosure;

FIG. 13 illustrates a cross-sectional side view of an example LED array with respective sets of columns of a diffuser material over each of a plurality of LEDs, according to other embodiments of the present disclosure.

DESCRIPTION OF EXAMPLE EMBODIMENTS OF THE DISCLOSURE

Overview

Figure 1:
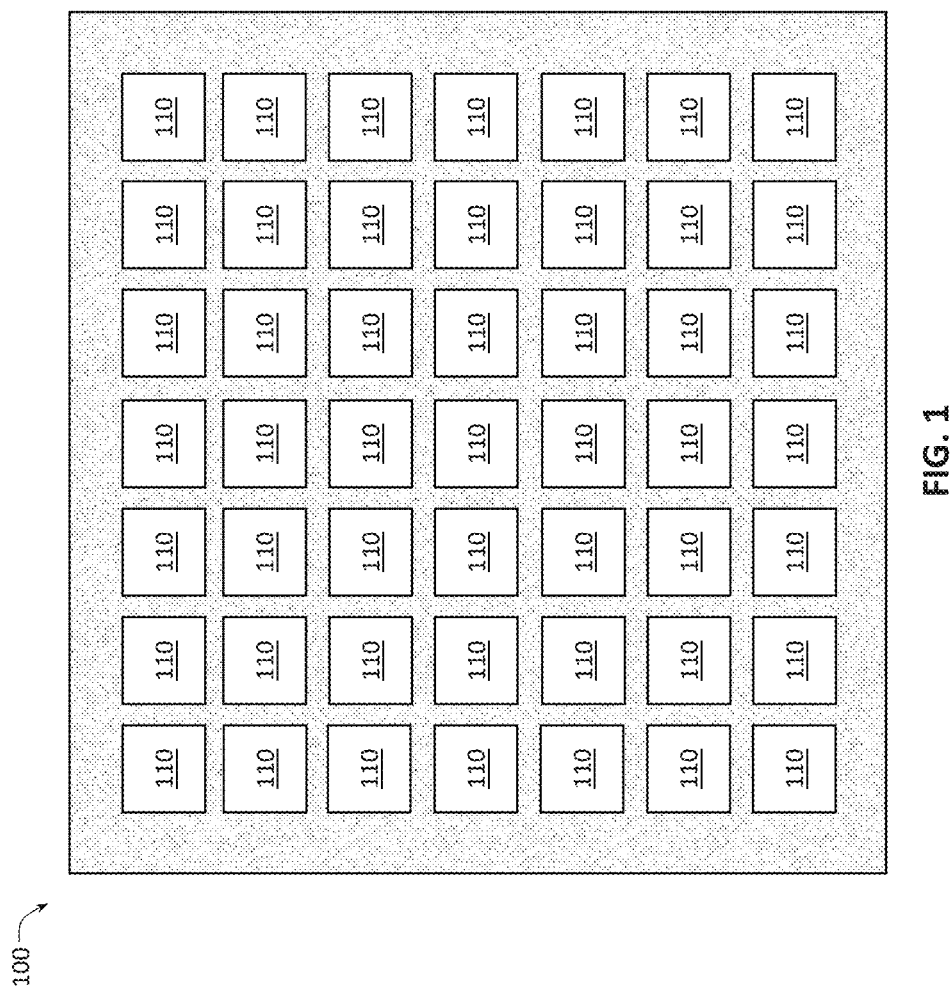
FIG. 1 illustrates a top-down view of an example LED array, according to some embodiments of the present disclosure.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

For purposes of illustrating segmented LED arrays with diffusing elements described herein, it might be useful to understand phenomena that may come into play in context of segmented LED arrays. The following foundational information may be viewed as a basis from which the present disclosure may be properly explained. Such information is offered for purposes of explanation only and, accordingly, should not be construed in any way to limit the broad scope of the present disclosure and its potential applications.

LED arrays with imaging optics can achieve superior results in, e.g., strobe and video illumination by illuminating regions in the scene which require light and leaving out those which are sufficiently illuminated. To achieve this goal with LEDs such as wavelength-converting LEDs (e.g., LEDs that use a certain structure to emit light of a first wavelength, e.g., a stack of a p- and an n-type semiconductor layers with an active material in between, and then further use a structure, e.g., a layer of a phosphor material, to covert the first wavelength to a second wavelength), special efforts are taken in order to separate the different segments sufficiently optically to avoid color errors. This leads to an emitter design with trenches or walls between the segments, extending up to the total thickness of the wavelength-converting layer. In general, a segmented LED array (also sometimes referred to as a "segmented LED matrix") is an array of LEDs arranged in segments so that there is no light tunneling between the segments, which may be achieved by means of having trenches and/or walls filled with an optically non-transparent material between the segments.

While useful in some applications, the walls between the segments of segmented LED arrays may be imaged by an imaging lens onto a scene, leading to a discernible patterned illumination, which may not be desirable. Defocusing the lens could help, but, in general, it may not be able to remove all of the patterns.

Embodiments of the present disclosure provide segmented LED arrays with various diffusing elements. In one aspect, a light emitter with a support structure (e.g., a substrate, a chip, or a die) and a segmented LED array provided over the support structure is disclosed. The segmented LED array may include a plurality of LEDs provided over the support structure and, optionally, optically and electrically separated from one another by trenches and/or walls. In some embodiments, the plurality of LEDs may be provided as monolithically, e.g., the LEDs may be monolithically grown on a single support structure or may be provided over a monolithic piece of support structure and then separated into individual LEDs, or individual segments, during the fabrication process. In other embodiments, the plurality of LEDs need not be monolithically grown on a single support structure, but may be diced and then arranged on a mount such that the neighboring LEDs are very close together. For example, the LEDs may be provided as an array of a multitude of LEDs that have been fabricated beforehand and then arranged together on the support structure. The plurality of LEDs may be arranged in a plurality of sections where a given section may include one or more LEDs and where each section may be aligned with a different respective optical element such as a lens.

In some embodiments, each LED may be a wavelength-converting LED in that it may include a light emitter arrangement (i.e., an arrangement configured to emit light, the arrangement being, e.g., a stack of a p- and an n-type semiconductor layers with an active material in-between) and a wavelength-converter structure (i.e., a material configured to convert the wavelength of the light emitted by the light emitter arrangement, e.g., a layer of a phosphor material) provided over the light emitter arrangement. In various embodiments of wavelength-converting LEDs, diffusing elements in the form of one or more structures of a diffuser material may be provided over the wavelength-converter structure of one or more LEDs, the one or more structures being in a light path between the wavelength-converter structure and at least one of the plurality of optical elements, and configured to diffuse light emerging from the wavelength-converter structure. In other embodiments, the LEDs do not have to be wavelength-converting, or a combination of wavelength-converting and not-wavelength converting LEDs may be used. For LEDs that do not employ wavelength-converter structures, diffusing elements in the form of one or more structures of a diffuser material may be provided over the light emitter arrangement of one or more LEDs, the one or more structures being in a light path between the light emitter arrangement and at least one of the plurality of optical elements, and configured to diffuse light emitted by the light emitter arrangement. For example, in some embodiments, a segmented LED array may be provided with diffusing elements in the form of a plurality of columns or domes of a diffuser material provided over the light emitter arrangement (e.g., over the wavelength-converter structure) of each LED and configured to diffuse light emerging from the light emitter arrangement (e.g., emerging from the wavelength-converter structure), where the plurality of columns are in a light path between the light emitter arrangement and at least one of the plurality of optical elements. In other embodiments, a segmented LED array may be provided with diffusing elements in the form of a dome-shaped structure of a diffuser material provided over the light emitter arrangement or the wavelength-converter structure of each LED, aligned with the LED, and configured to diffuse light emerging from the light emitter arrangement or the wavelength-converter structure, where the dome-shaped structure is in a light path between the light emitter arrangement or the wavelength-converter structure and at least one of the plurality of optical elements. In still other embodiments, a segmented LED array may be provided with diffusing elements in the form of a continuous layer of a diffuser material provided over the light emitter arrangement or the wavelength-converter structure of at least two or more LEDs and configured to diffuse light emerging from the light emitter arrangement or the wavelength-converter structure of the at least two or more LEDs, the diffuser material being in a light path between the light emitter arrangement or the wavelength-converter structure of the at least two or more LEDs and at least one of the plurality of optical elements. Providing the diffusing elements directly over the light emitter arrangement or the wavelength-converter structure of the LEDs, before the light is incident on secondary optics in the form of optical elements, may help achieving more uniform illumination and tune luminance distribution using segmented LED arrays. Other features and advantages of the disclosure will be apparent from the following description and the claims. In the following, the descriptions are provided with reference to wavelength-converting LEDs, i.e., LEDs that use both the light emitter arrangement and the wavelength-converter structure. However, these descriptions are equally applicable to embodiments where at least some of the LEDs do not include the wavelength-converter structure, in which case references to the "wavelength-converter structure" in the descriptions are to be replaced with references to the "light emitter arrangement" instead, all of which embodiments being within the scope of the present disclosure.

In the drawings (e.g., in FIGS. 2A-13), some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers. There may be other defects not listed here but that are common within the field of device fabrication.

As will be appreciated by one skilled in the art, aspects of the present disclosure, in particular aspects of segmented LED arrays with diffusing elements, described herein, may be embodied in various manners—e.g. as a method, a system, a method of fabrication, or a method of operation. In the following detailed description, various aspects of the illustrative implementations may be described using terms commonly employed by those skilled in the art to convey the substance of their work to others skilled in the art. For example, the term "circuit" may refer to one or more passive and/or active components that are arranged to cooperate with one another to provide a desired function. The terms "substantially," "close," "approximately," "near," and "about," generally refer to being within +/−20%, preferably within +/−10%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art. The terms such as "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, showing, by way of illustration, some of the embodiments that may be practiced. In the drawings, same reference numerals refer to the same or analogous elements/materials so that, unless stated otherwise, explanations of an element/material with a given reference numeral provided in context of one of the drawings are applicable to other drawings where elements/materials with the same reference numerals may be illustrated. The accompanying drawings are not necessarily drawn to scale. Moreover, it will be understood that certain embodiments can include more elements than illustrated in a drawing, certain embodiments can include a subset of the elements illustrated in a drawing, and certain embodiments can incorporate any suitable combination of features from two or more drawings.

It should be appreciated that the devices and systems described herein can be consolidated in any suitable manner. For example, any of the illustrated components, modules, and elements of the accompanying drawings may be combined in various possible configurations, all of which are clearly within the broad scope of the present disclosure. In certain cases, it may be easier to describe a device or a system by only referencing a limited number of elements, but, in general, devices and systems with number of elements other than what is described or shown in the drawings are within the scope of the present disclosure.

The following detailed description presents various descriptions of specific certain embodiments. However, is to be understood that other embodiments may be utilized, and structural or logical changes may be made without departing from the scope of the present disclosure. In general, the innovations described herein can be embodied in a multitude of different ways, for example, as defined and covered by the claims and/or select examples, and the following detailed description is not to be taken in a limiting sense.

Example Segmented LED Arrays

FIG. 1 illustrates a top-down view of an example LED array 100, according to some embodiments of the present disclosure. As shown in FIG. 1, the LED array 100 may include a plurality of LEDs 110 arranged in an array or a matrix. Though a 7×7 square array is illustrated in FIG. 1, any suitable number of LEDs may be used, and the array 100 need not be square, it may be rectangular or any suitable shape. The LEDs 110 may be, e.g., white LEDs, or other visible colors as red, green or blue LEDs, ultraviolet (UV) LEDs, infrared (IR) LEDs, or a combination thereof.

In some embodiments, the LEDs 110 may be monolithically grown on a single support structure, e.g., on a single substrate. Alternatively, the LEDs 110 need not be monolithically grown on a single substrate, but may be diced then arranged on a mount such that neighboring LEDs are very close together. In some embodiments, the gap between adjacent ones of the LEDs 110 may be less than ⅓ of a dimension (for example, the width) of an individual LED 110. The size of the individual LEDs 110 may depend on several design parameters as, for example, building volume with optical lens included, field of view of the camera and number of LEDs 110 in the array 100. Though the individual LEDs 110 are shown in FIG. 1 to be square, this is not required; in other embodiments of the LED array 100, rectangular LEDs 110 or LEDs 110 of any suitable shape may be used.

Figure 2A:
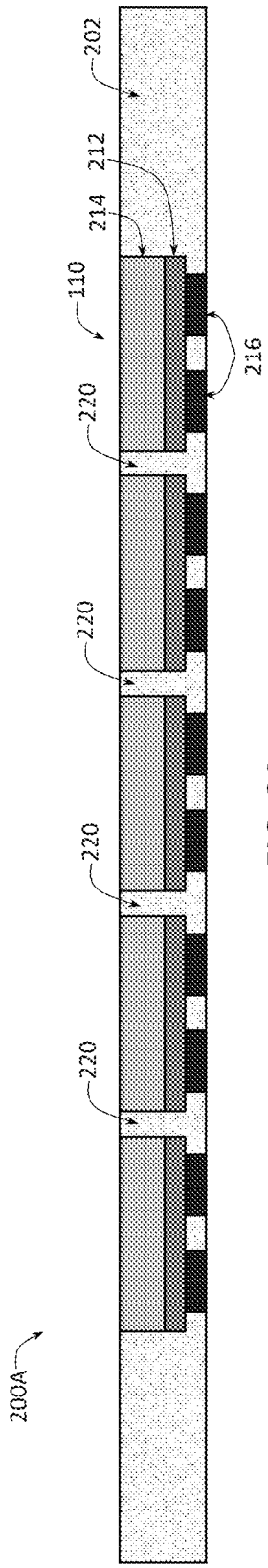
FIG. 2A illustrates a cross-sectional side view of an example LED array with adjacent LEDs separated by trenches, according to some embodiments of the present disclosure.
Figure 2B:
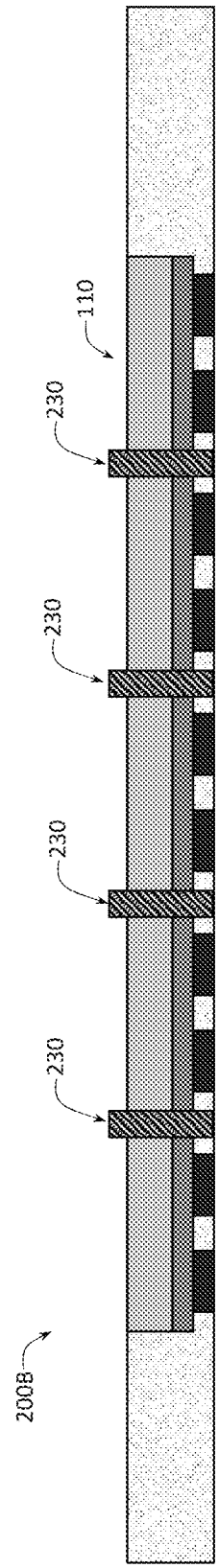
FIG. 2B illustrates a cross-sectional side view of an example LED array with adjacent LEDs separated by walls, according to some embodiments of the present disclosure.

FIG. 2A illustrates a cross-sectional side view of an example LED array 200A with adjacent LEDs 110 separated by trenches, according to some embodiments of the present disclosure, while FIG. 2B illustrates a cross-sectional side view of an example LED array 200B with adjacent LEDs 110 separated by walls, according to some embodiments of the present disclosure. Each of the arrays 200A and 200B may be seen as an example of the LED array 100, but now illustrating only 5 LEDs 110 in a given row (as described above, any number of the LEDs 110 may be included in the LED array 100), where only a single LED 110 is labeled with a reference numeral (while 5 are shown) in order to not clutter the drawings.

As shown in FIG. 2A, in some embodiments, an individual LED 110 may include a light emitter arrangement 212, a wavelength-converter structure 214 provided over the light emitter arrangement 212, and interconnects (or contacts) 216. In other embodiments, the wavelength-converter structure 214 may not be included in at least some of the LEDs 110.

In some embodiments, the light emitter arrangement 212 may be formed by growing a III-nitride material (i.e., a material including nitrogen and an element from group III of the periodic table, e.g., gallium nitride for blue or UV LEDs) or III-arsenide (i.e., a material including arsenic and an element from group III of the periodic table, e.g., gallium arsenide for IR LEDs) semiconductor structure on a growth substrate (not specifically shown in FIGS. 2A and 2B, although a support structure 202 could be such a grown substrate in some cases) as is known in the art. In some embodiments, the growth substrate may be sapphire but, in other embodiments, it may be any suitable substrate such as, for example, a non-III-nitride material, silicon carbide (SiC), silicon (Si), gallium nitride (GaN), or a composite substrate. A surface of the growth substrate on which the III-nitride or III-arsenide semiconductor structure is grown may be patterned, roughened, or textured before growth, which may improve light extraction from the device. A surface of the growth substrate opposite the growth surface (i.e. the surface through which a majority of light is extracted to be incident onto the wavelength-converter structure 214) may be patterned, roughened or textured before or after growth, which may improve light extraction from the device. In some embodiments, the support structure 202 may include multiple layers of various materials.

Although not specifically shown in FIG. 2A, in some embodiments, the semiconductor structure of the light emitter arrangement 212 may include a light emitting or active region sandwiched between n- and p-type regions. In some embodiments, an n-type region may be grown first and may include multiple layers of different compositions and dopant concentration including, for example, preparation layers such as buffer layers or nucleation layers, which may be n-type or not intentionally doped, and n- or even p-type device layers designed for particular optical, material, or electrical properties desirable for the light emitting region to efficiently emit light. A light emitting or active region may then be grown over the n-type region. Examples of suitable light emitting regions include a single thick or thin light emitting layer, or a multiple quantum well light emitting region including multiple thin or thick light emitting layers separated by barrier layers. A p-type region may then be grown over light emitting region. Similar to the n-type region, the p-type region may include multiple layers of different composition, thickness, and dopant concentration, including layers that are not intentionally doped, or n-type layers.

As described above, LEDs 110 in the array 200A may be formed on a single wafer, then diced, scribed or etched or other manufacturing processes to separate the emitting segments from each other on the wafer such that an array 200A with individual addressable LED segments in the array are still attached to each other. Alternatively, many LEDs 110 may be formed on a single wafer, then diced from the wafer, such that already-diced, individual LEDs are disposed on a mount to form the array 200A.

If used, the wavelength-converter structure 214 may be disposed in the path of light emitted by the light emitter arrangement 212. In some embodiments, the wavelength-converter structure 214 may include one or more wavelength-converting materials which may be, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce. A wavelength-converting material of the wavelength-converter structure 214 may absorb light emitted by the light emitter arrangement 212 of the LED 110 and emit light of one or more different wavelengths. In the embodiments of LEDs that do employ the wavelength-converter structure 214, unconverted light emitted by the light emitter arrangement 212 may, but does not have to be, part of the final spectrum of light extracted from the LED 110. The final spectrum of light extracted from the LED 110 may be white, polychromatic, or monochromatic. Examples of common combinations include a blue-emitting light emitter arrangement 212 combined with a yellow-emitting wavelength-converter structure 214, a blue-emitting light emitter arrangement 212 combined with green- and red-emitting wavelength-converter structure 214, a UV-emitting light emitter arrangement 212 combined with blue- and yellow-emitting wavelength-converter structures 214, and a UV-emitting light emitter arrangement 212 combined with blue-, green-, and red-emitting wavelength-converter structures 214. Wavelength-converting materials emitting other colors of light may be added to tailor the spectrum of light extracted from the structure. In some embodiments, the wavelength-converter structure 214 may include light scattering or light diffusing elements such as titanium oxide (TiO2).

In some embodiments, the wavelength-converter structure 214 may be a structure that is fabricated separately from the light emitter arrangement 212 and attached to the light emitter arrangement 212, for example through wafer bonding or a suitable adhesive such as silicone or epoxy. One example of such a prefabricated wavelength-converting element is a ceramic phosphor, which is formed by, for example, sintering powder phosphor or the precursor materials of phosphor into a ceramic slab, which may then be diced into individual wavelength-converting elements. A ceramic phosphor may also be formed by, for example tape casting, where the ceramic is fabricated to the correct shape, with no dicing or cutting necessary. Examples of suitable non-ceramic pre-formed wavelength-converting elements include powder phosphors that are dispersed in transparent material such as silicone or glass that is rolled, cast, or otherwise formed into a sheet, then singulated into individual wavelength-converting elements, powder phosphors that are disposed in a transparent material such as silicone and laminated over the wafer of LEDs or individual LEDs, and phosphor mixed with silicone and disposed on a transparent substrate. The wavelength-converting element need not be pre-formed, it may be, for example, wavelength-converting material mixed with transparent binder that is laminated, dispensed, deposited, screen-printed, electrophoretically deposited, or otherwise positioned in the path of light emitted by the light emitter arrangements 212 of the LEDs 110.

In some embodiments, the wavelength-converter structure 214 may be disposed in direct contact with the light emitter arrangement 212 in some or all LEDs 110, as illustrated in FIG. 2A. In other embodiments of the LED array 200A, the wavelength-converter structure 214 need not be disposed in direct contact with the light emitter arrangement 212 and may be spaced apart from the light emitter arrangement 212 in one or more of the LEDs 110.

Interconnects 216 such as, for example, solder, stud bumps, gold layers, or any other suitable structure, may be used to electrically and physically connect LEDs 110 in the array 200A to a structure such as a mount, a printed circuit board, or any other suitable structure. The mount may be configured such that individual LEDs 110 may be individually controlled by a driver (e.g., by an LED driver 1416 of FIG. 14). The light emitted by the individual LEDs 110 may illuminate a different part of the scene. By changing the current to the individual LEDs 110, the light provided to a corresponding part of the scene can be modified.

As also shown in FIG. 2A, adjacent LEDs 110 may be separated by trenches 220. The trenches 220 may be filled with a material that is substantially non-transparent so that there is substantially no light tunneling between the different LEDs 110. Example materials that may be used to fill the trenches 220 include highly scattering materials achieved by mixing two materials with a large difference in refractive index, such as one or more of titanium dioxide, zirconium oxide or tantalum oxide dispersed in low refractive index silicone. Providing metallic flakes in a matrix may produce a reflective effect, if geometry allows, and may also be used in the trenches 220. In some embodiments, absorbing materials such as carbon dispersed in silicone could also be used to fill the trenches 220 to help provide largest contrast between the segments.

FIG. 2B illustrates a similar LED array as that shown in FIG. 2A, except that it further illustrates that, in some embodiments, walls 230 may be provided within the trenches 220. In some embodiments, the walls 230 may be taller than the LED 110 that is enclosed between the adjacent walls 230, as shown in FIG. 2B, thus preventing light emitted by that LED from travelling sideways towards neighboring LEDs. In other embodiments, the walls 230 may be the same height as the LEDs 110. In some embodiments aspects, the walls 230 may be formed of any suitable material (e.g., glass, metal, silicon etc.) with reflective coating, such as a metal (e.g., silver) or dielectric distributed Bragg reflectors (DBRs), for example. In some aspects, the walls 230 may be formed by a premixed combination of materials, such as a matrix grid formed from silicone mixed with titanium dioxide. In some implementations, the walls 230 may be between 100% and 200% of the height of the LED 110 that is enclosed in it. The walls 230 may be formed using any suitable type of process, such as plasma enhanced chemical vapor deposition, atomic layer deposition, evaporation deposition, sputtering deposition, etching processes or silicone molding. All other descriptions provided with respect to the LED array 200A are applicable to the LED array 200B and, therefore, in the interests of brevity are not repeated.

Figure 3:
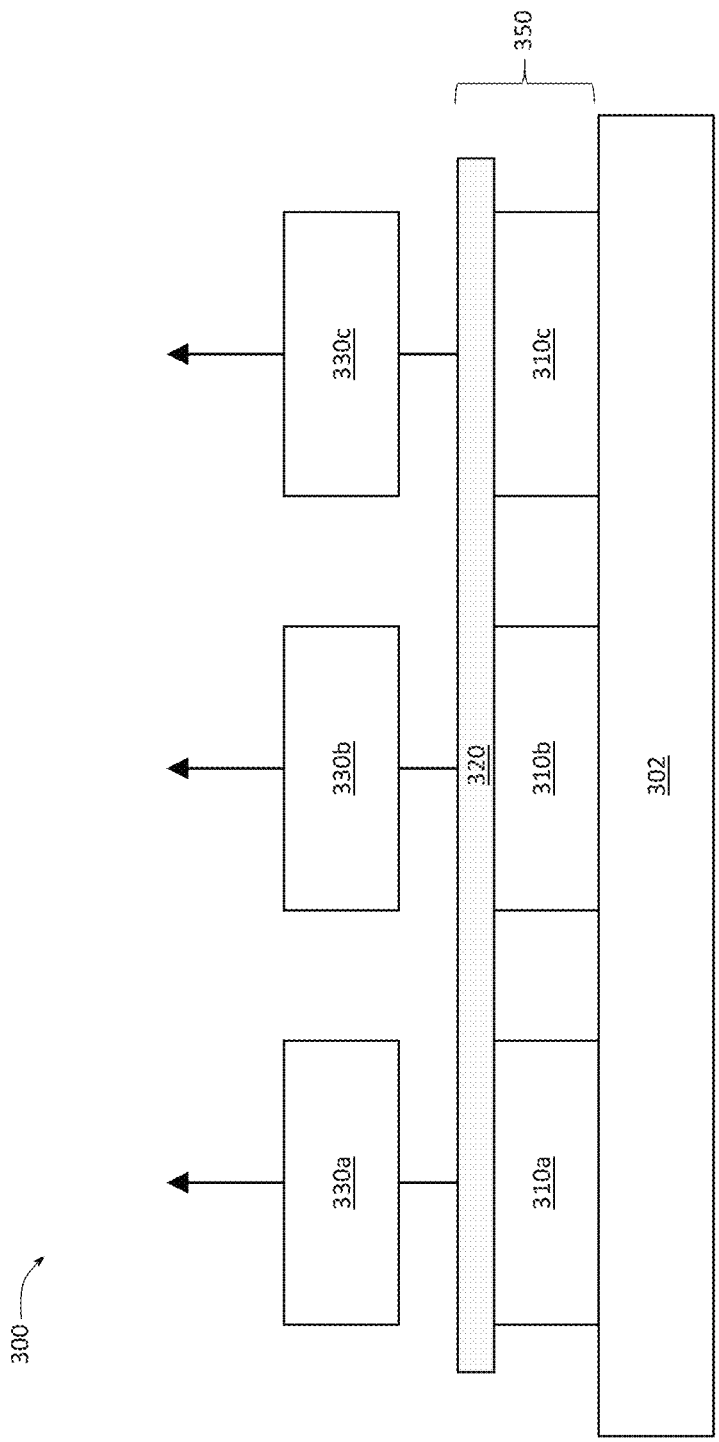
FIG. 3 provides a block diagram illustrating an example light emitter with LEDs and optical elements, according to some embodiments of the present disclosure.

Segmented LED arrays as described herein, e.g., the segmented LED arrays 100, 200A, or 200B, where the individual LEDs 110 may, but do not have to, include the wavelength-converter structure 214, may be included in a light emitter. FIG. 3 provides a block diagram illustrating an example light emitter 300 with LEDs and optical elements, according to some embodiments of the present disclosure. As shown in FIG. 3, the light emitter 300 may include a support structure 302 (e.g., a substrate, a chip, or a die), and an LED array that includes a plurality of LED sections 310 provided over the support structure 302. In the example of FIG. 3, three sections 310 are shown, labeled as LED sections 310a, 310b, and 310c, but in other embodiments any other number of sections 310 may be used. Each of the sections 310 may include one or more LEDs 110 as described above, and, together, the LEDs 110 of the LED sections 30 form an LED array such as any of the LED arrays 100, 200A, or 200B, described above.

As further shown in FIG. 3, each of the sections 310 may be aligned with a different optical element 330, the individual optical elements labeled in FIG. 3 as optical elements 330a, 330b, and 330c. In various embodiments, the optical elements 330 may include lenses, apertures (e.g., barrels or lens barrels), or, more generally, any suitable type of device that is configured to guide light emitted by the LEDs 110 of the LED sections 310 to/from particular directions.

As also shown in FIG. 3, diffusing elements may be provided in a layer 320 which is in the light path between the LEDs 110 of the LED sections 310 and the optical elements 330. In particular, diffusing elements in the form of one or more structures of a diffuser material may be provided over the light emitter arrangement 212 (e.g., over the wavelength-converter structure 214, if such a structure is used) of one or more LEDs 110 of any of the LED sections 310, the one or more structures of a diffuser material being in the layer 320 in the light path between the light emitter arrangement 212 and at least one of the plurality of optical elements 330, e.g., between the wavelength-converter structure 214 and at least one of the plurality of optical elements 330. Such diffusing elements may be configured to diffuse light emitted by the light emitter arrangement 212 or emerging from the wavelength-converter structure(s) 214 of the LEDs 110. A diffusing segmented LED arrangement 350, labeled in FIG. 3, refers to a combination of the LEDs 110 of an LED array, e.g., a segmented LED array 100, 200A, or 200B (again, with or without the wavelength-converter structures 214), and one or more diffusing elements provided in the layer 320 over one or more of the light emitter arrangement 212 or the wavelength-converter structures 214 of the one or more LEDs 110. FIGS. 4-13, described below, provide different examples of the diffusing segmented LED arrangement 350.

Various Diffusing Element(s) Designs

FIG. 4 illustrates a cross-sectional side view of an example LED array 400 with a continuous layer of a diffuser material 420 over a plurality of the LEDs 110, according to some embodiments of the present disclosure. The LEDs 110 shown in FIG. 4 (only one of which is labeled in order to not clutter the drawing) may be the LEDs of any of the LED arrays described with reference to FIGS. 1, 2A, and 2B. Together, the plurality of the LEDs 110 and the diffuser material 420 provide one example of the diffusing segmented LED arrangement 350 described with reference to FIG. 3, where the layer of the diffuser material 420 as shown in FIG. 4 is an example of a diffusing element of the layer 320. The diffuser material 420 may be, e.g., a volume diffuser material such as titanium oxide containing silicone, zirconia, tantalum oxide, or aluminum oxide containing low refractive index silicone, magnesium fluoride dispersed in high refractive silicone or porous glass or sol-gel structures. In some examples, a thickness of the diffuser material 420 may be between about 0.01 and 0.5 millimeters, including all values and ranges therein.

FIG. 5 illustrates a cross-sectional side view of an example LED array 500 with a continuous layer of a diffuser material 520 over an optically transparent material 522 over a plurality of the LEDs 110, according to some embodiments of the present disclosure. The LEDs 110 shown in FIG. 5 (only one of which is labeled in order to not clutter the drawing) may be the LEDs of any of the LED arrays described with reference to FIGS. 1, 2A, and 2B. Together, the plurality of the LEDs 110, the diffuser material 520, and the optically transparent material 522 provide one example of the diffusing segmented LED arrangement 350 described with reference to FIG. 3, where a combination of the layer of the diffuser material 520 and the layer of the optically transparent material 522 as shown in FIG. 5 is an example of a diffusing element of the layer 320. The diffuser material 520 may be any of the materials listed for the diffuser material 420. The optically transparent material 522 may be a substantially optically transparent material, e.g., a material that is at least about 90% transparent to the light emitted from the wavelength-converter structure 214 of the LEDs 110, such as silicone, glass, epoxy, sol-gel. In some examples, a thickness of the diffuser material 520 may be between about 0.01 and 0.5 millimeters, including all values and ranges therein. In some examples, a thickness of the optically transparent material 522 may be between about 0.01 and 0.5 millimeters, including all values and ranges therein.

FIG. 6 illustrates a cross-sectional side view of an example LED array 600 with a continuous layer of an optically transparent material 622 with an irregular rough surface 624 over a plurality of the LEDs 110, according to some embodiments of the present disclosure. The LEDs 110 shown in FIG. 6 (only one of which is labeled in order to not clutter the drawing) may be the LEDs of any of the LED arrays described with reference to FIGS. 1, 2A, and 2B. Together, the plurality of the LEDs 110 and the optically transparent material 622 with the irregular rough surface 624 provide one example of the diffusing segmented LED arrangement 350 described with reference to FIG. 3, where the optically transparent material 622 with the irregular rough surface 624 as shown in FIG. 6 is an example of a diffusing element of the layer 320 because the irregular rough surface 624 may act as a surface diffuser for the light emitted from the wavelength-converter material 214 of the LEDs 110. The optically transparent material 622 may be any of the materials listed for the optically transparent material 522. In some examples, an average thickness of the optically transparent material 622 may be between about 0.01 and 0.5 millimeters, including all values and ranges therein. In some examples, a surface roughness of the optically transparent material 622 may be between about 10 nanometers and 200 micrometers, including all values and ranges therein.

Although not specifically shown in the present drawings, in further embodiments, the diffusing element of the layer 320 may be realized by implementing the optically transparent material 622 with the irregular rough surface 624 as shown in FIG. 6 except that at least some, or all of the optically transparent material 622 may be replaced with a diffuser material such as any of the materials listed for the diffuser material 420. In still further embodiments, such a diffuser material may be provided as a layer or over certain portions of the LEDs 110 in addition to the optically transparent material 622 with the irregular rough surface 624 as shown in FIG. 6.

FIG. 7 illustrates a cross-sectional side view of an example LED array 700 with a continuous layer of an optically transparent material 722 with a surface 724 that includes periodic shapes, over a plurality of the LEDs 110, according to some embodiments of the present disclosure. The LEDs 110 shown in FIG. 7 (only one of which is labeled in order to not clutter the drawing) may be the LEDs of any of the LED arrays described with reference to FIGS. 1, 2A, and 2B. Together, the plurality of the LEDs 110 and the optically transparent material 722 with the structured repeating pattern surface 724 provide one example of the diffusing segmented LED arrangement 350 described with reference to FIG. 3, where the optically transparent material 722 with the periodic structured surface 724 as shown in FIG. 7 is an example of a diffusing element of the layer 320 because the periodic structured surface 724 may act as a surface diffuser for the light emitted from the wavelength-converter material 214 of the LEDs 110. While FIG. 7 illustrates the surface 724 that includes half-dome shapes, in other embodiments, the surface 724 may include a periodic repeating pattern of any other shapes, e.g., triangles, columns, etc. The optically transparent material 722 may be any of the materials listed for the optically transparent material 522. In some examples, an average thickness of the optically transparent material 722 may be between about 0.01 and 0.5 millimeters, including all values and ranges therein. In some examples, a surface roughness of the optically transparent material 722 may be between about 10 nanometers and 200 micrometers, including all values and ranges therein.

Although not specifically shown in the present drawings, in further embodiments, the diffusing element of the layer 320 may be realized by implementing the optically transparent material 722 with the periodic structured surface 724 as described with reference to FIG. 7 except that at least some, or all of the optically transparent material 722 may be replaced with a diffuser material such as any of the materials listed for the diffuser material 420. In still further embodiments, such a diffuser material may be provided as a layer or over certain portions of the LEDs 110 in addition to the optically transparent material 722 with the periodic structured surface 724 as shown in FIG. 7.

FIG. 8 illustrates a cross-sectional side view of an example LED array 800 with a continuous layer of a diffuser material 820 over a plurality of the LEDs 110 with partial segmentation, according to some embodiments of the present disclosure. The LEDs 110 shown in FIG. 8 (only one of which is labeled in order to not clutter the drawing) may be the LEDs of any of the LED arrays described with reference to FIGS. 1, 2A, and 2B. Together, the plurality of the LEDs 110, the diffuser material 820, and the partial segmentation implemented as walls 830 (only one of which is labeled in FIG. 8 in order to not clutter the drawing) between adjacent LEDs 110 provide one example of the diffusing segmented LED arrangement 350 described with reference to FIG. 3, where the layer of the diffuser material 820 as shown in FIG. 8 is an example of a diffusing element of the layer 320. The diffuser material 820 may be any of the materials listed for the diffuser material 420. In some examples, a thickness of the diffuser material 820 may be about the same as that of the diffuser material 420. In some examples, a height of the walls 830 may be between about 0.01 and 0.5 millimeters, including all values and ranges therein. The walls 826 may be made of any of the materials listed for the walls 230.

FIG. 9 illustrates a cross-sectional side view of an example LED array 900 with respective dome-shaped structures 940 of a diffuser material 920 over each of a plurality of the LEDs 110, according to some embodiments of the present disclosure. As shown in FIG. 9, in some embodiments, each of the dome-shaped structures 940 may be aligned with the respective LED 110. In some embodiments, for at least one LED 110, the dome-shaped structure 940 may have a substantially convex shape with a base 942 of the dome-shaped structure 942 aligned with the wavelength-converter structure and with a tip 944 of the dome-shaped structure extending away from the wavelength-converter structure 214. This geometry is shown in the example of FIG. 9 for all of the LEDs 110. In some embodiments, the base 942 of the dome-shaped structures 940 may be in contact with the corresponding wavelength-converter structures 214. The dome-shaped structures 940 may be configured to diffuse light emerging from the wavelength-converter structure 214 of the respective LEDs 110 by virtue of being formed from the diffuser material 920. In some embodiments, an optically transparent material 922 may be provided over the dome-shaped structures 940. The LEDs 110 shown in FIG. 9 (only one of which is labeled in order to not clutter the drawing) may be the LEDs of any of the LED arrays described with reference to FIGS. 1, 2A, and 2B. Together, the plurality of the LEDs 110, the dome-shaped structures 940 of the diffuser material 920, and, optionally, the optically transparent material 922 provide one example of the diffusing segmented LED arrangement 350 described with reference to FIG. 3, where the dome-shaped structures 940 of the diffuser material 920 are examples of diffusing elements of the layer 320. The diffuser material 920 may be any of the materials listed for the diffuser material 420. The optically transparent material 922 may be any of the materials listed for the optically transparent material 522. In some examples, a thickness of the diffuser material 920 at the center of the dome-shaped structures 940 may be about the same as that of the diffuser material 420.

FIG. 10 illustrates a cross-sectional side view of an example LED array 1000 with respective dome-shaped structures 1040 of a diffuser material 1020 over each of a plurality of the LEDs 110, according to some embodiments of the present disclosure. As shown in FIG. 10, in some embodiments, each of the dome-shaped structures 1040 may be aligned with the respective LED 110. In some embodiments, for at least one LED 110, the dome-shaped structure 1040 may have a substantially convex shape with a base 1042 of the dome-shaped structure 1042 being parallel to the wavelength-converter structure 214 and at a distance from the wavelength-converter structure 214, and with a tip 1044 of the dome-shaped structure extending towards the wavelength-converter structure 2:14. This geometry is shown in the example of FIG. 10 for all of the LEDs 110. In some embodiments, an optically transparent material 1022 may be provided between the dome-shaped structures 1040 and the wavelength-converter structures 214, so that the tip 1044 is at a certain distance from the corresponding wavelength-converter structure 214, as shown in FIG. 10. In other embodiments, the dome-shaped structures 1040 may be implemented simply as the inverted version of the dome-shaped structures 940 shown in FIG. 9 in that the tip 1044 may be in contact with the corresponding wavelength-converter structure 214 (such an arrangement not specifically shown in the present drawings). The dome-shaped structures 1040 may be configured to diffuse light emerging from the wavelength-converter structure 214 of the respective LEDs 110 by virtue of being formed from the diffuser material 1020. The LEDs 110 shown in FIG. 10 (only one of which is labeled in order to not clutter the drawing) may be the LEDs of any of the LED arrays described with reference to FIGS. 1, 2A, and 2B. Together, the plurality of the LEDs 110, the dome-shaped structures 1040 of the diffuser material 1020, and, optionally, the optically transparent material 1022 provide one example of the diffusing segmented LED arrangement 350 described with reference to FIG. 3, where the dome-shaped structures 1040 of the diffuser material 1020 are examples of diffusing elements of the layer 320. The diffuser material 1020 may be any of the materials listed for the diffuser material 420. The optically transparent material 1022 may be any of the materials listed for the optically transparent material 522. In some examples, a thickness of the diffuser material 1020 at the center of the dome-shaped structures 1040 may be about the same as that of the diffuser material 420.

FIG. 11 illustrates a cross-sectional side view of an example LED array 1100 with respective dome-shaped structures 1140 of a diffuser material 1120 with a rough or structured surface 1124 over each of the plurality of LEDs 110, according to some embodiments of the present disclosure. As shown in FIG. 11, in some embodiments, each of the dome-shaped structures 1140 may be aligned with the respective LED 110. In some embodiments, for at least one LED 110, the dome-shaped structure 1140 may have a substantially convex shape with a base 1142 of the dome-shaped structure 1142 aligned with the wavelength-converter structure, similar to the embodiment of FIG. 9. Different from FIG. 9 is that the surface 1124 of the dome-shaped structures 1140 may be rough or structured, e.g., similar to the surface 624 or the surface 724 described with reference to FIGS. 6 and 7, respectively. In some embodiments, a surface roughness of a portion of the dome-shaped structure 1140 extending away from the wavelength-converter structure 214 (i.e., not the base 1142 of the structure 1140) may be between about 10 nanometers and 200 micrometers, including all values and ranges therein. Such embodiments of providing either rough surface or otherwise shaped surfaces (e.g., providing multiple domes or multiple cones above each LED 110) may allow for deviation of the dome shape, e.g., when the luminance distribution of the LED 110 may not have a continuous decrease center to edges but might also have a more complex luminance over position dependence, e.g., due to thermal differences or current crowding.

In some embodiments, the base 1142 of the dome-shaped structures 1140 may be in contact with the corresponding wavelength-converter structures 214. The dome-shaped structures 1140 may be configured to diffuse light emerging from the wavelength-converter structure 214 of the respective LEDs 110 by virtue of being formed from the diffuser material 1120. In some embodiments, an optically transparent material 1122 may be provided over the dome-shaped structures 1140. The LEDs 110 shown in FIG. 11 (only one of which is labeled in order to not clutter the drawing) may be the LEDs of any of the LED arrays described with reference to FIGS. 1, 2A, and 2B. Together, the plurality of the LEDs 110, the dome-shaped structures 1140 of the diffuser material 1120, and, optionally, the optically transparent material 1122 provide one example of the diffusing segmented LED arrangement 350 described with reference to FIG. 3, where the dome-shaped structures 1140 of the diffuser material 1120 are examples of diffusing elements of the layer 320. The diffuser material 1120 may be any of the materials listed for the diffuser material 420. The optically transparent material 1122 may be any of the materials listed for the optically transparent material 522. In some examples, an average thickness of the diffuser material 1120 at the center of the dome-shaped structures 1140 may be about the same as that of the diffuser material 420.

Although not specifically shown in the present drawings, in further embodiments, the diffusing element of the layer 320 may be realized by implementing the dome-shaped structures 1040 as described with reference to FIG. 10 except that at least some, or all of the dome-shaped structures 1040 may have a rough or structured surface as described with reference to the surface 1124 of the dome-shaped structures 1140 of FIG. 11. Furthermore, although also not specifically shown in the present drawings, in some embodiments, the dome-shaped structures as described herein may be implemented as cones or any other dome-like structures. Still further, although also not specifically shown in the present drawings, in some embodiments, the dome-shaped structures as described herein may extend over a plurality of LEDs 110 and/or over a plurality of LED segments 310.

FIG. 12 illustrates a cross-sectional side view of an example LED array 1200 with respective sets 1250 of columns 1252 of a diffuser material 1220 over each of a plurality of the LEDs 110, according to some embodiments of the present disclosure. In some embodiments, optionally, a substantially optically transparent material 1222 may be provided between the columns 1252 and/or above the columns 1252. The LEDs 110 shown in FIG. 12 (only one of which is labeled in order to not clutter the drawing) may be the LEDs of any of the LED arrays described with reference to FIGS. 1, 2A, and 2B. Together, the plurality of the LEDs 110, the sets 1250 of the columns 1252, and, optionally, the optically transparent material 1222 provide one example of the diffusing segmented LED arrangement 350 described with reference to FIG. 3, where the sets 1250 of the columns 1252 are examples of diffusing elements of the layer 320.

The diffuser material 1220 may be any of the materials listed for the diffuser material 420. The optically transparent material 1222 may be any of the materials listed for the optically transparent material 522. As shown in FIG. 12, in some embodiments, each of the sets 1250 may be aligned with the respective LED 110. In some embodiments, for at least one LED 110, a density of the plurality of columns 1252 may be higher in a region centered around an optical axis of the LED 110 (the optical axis schematically illustrated in FIG. 12 with a dashed line 1260 for one of the LEDs 110) than in a region farther away from the optical axis 1260 of the LED 119. In other words, the density of the columns 1252 may be higher in the central region of the LED 110 compared to that at the periphery of the LED 110. In some embodiments, for at least one LED 110, a width of each of the columns 1252 (where, as used herein, the term "width" refers to a dimension measured in a direction in a plane parallel to the support structure over/in which the LEDs 110 are provided) may be between about 0.01% (e.g., so-called "meta-lens" type structures, e.g., photonic crystals) and 10%, e.g., between about 5% and 10% of a width of the LED 110, e.g., of the width of the wavelength-converter structure 214 of the LED 110. In some embodiments, for at least one LED 110, a height of each of the columns 1252 (where, as used herein, the term "height" refers to a dimension measured in a direction perpendicular to the support structure over/in which the LEDs 110 are provided) may be between about 0.1 micrometers (e.g., for the meta-lens type structures) and 500 micrometers, e.g., between about 10 and 500 micrometers, including all values and ranges therein, e.g., between about 50 and 100 micrometers. In some embodiments, for at least some, or all LEDs 119, there may be a layer of the diffuser material 1220 between the wavelength-converter structure(s) 214 and the set(s) 1250 of columns 1252, as shown in FIG. 12 for all of the LEDs 110. In such embodiments, the layer of the diffuser material 1220 may be in contact with the wavelength-converter structures 214 of the LEDs 110 and the plurality of columns 1252 of each of the sets 1250 may be in contact with the layer of the diffuser material 1220 underneath the columns.

FIG. 13 illustrates a cross-sectional side view of an example LED array 1300 with respective sets 1350 of columns 1350 of the diffuser material 1220 over each of a plurality of LEDs 110, according to other embodiments of the present disclosure. FIG. 13 illustrates an embodiment as that shown in FIG. 12 except where the diffuser material 1220 and the optically transparent material 1222 are switched with one another. Except for this, other descriptions provided with respect to FIG. 12 are applicable to FIG. 13 and, in the interests of brevity, are not repeated.

Although not specifically shown in the present drawings, in further embodiments, the columns 1252 or 1352 may have other shapes, e.g., may be rounded, dome-shaped or cone-shaped. Furthermore, although also not specifically shown in the present drawings, in some embodiments, the sets 1250/1350 of columns 1252/1352 as described herein may extend over a plurality of LEDs 110 and/or over a plurality of LED segments 310.

Various designs of diffusing elements illustrated in FIGS. 4-13 and described above provide some examples of diffusing elements that may be provided in the light path between the wavelength-converter structures 214 and the optical elements 330. Some combinations of the various embodiments of FIGS. 4-13 have been described above. However, in further embodiments, further combinations of the various embodiments of FIGS. 4-13 may be possible and are within the scope of the present disclosure. For example, in some further embodiments, the columns 1252/1352 as described with reference to FIGS. 12 and 13 may have rough or structured surfaces as described with reference to FIGS. 6 and 7. In another example, in some further embodiments, partial segmentation implemented with the walls 830 as described with reference to FIG. 8 may be included in any other embodiments described with reference to FIGS. 5-7 and 9-13. In yet one more example, in some further embodiments, the walls 230 as described with reference to FIG. 2B may be included in any of the embodiments described with reference to FIG. 443. Furthermore, all of the designs of diffusing elements illustrated in FIGS. 4-13 and described above, including all variations described herein, are equally applicable to embodiments there the wavelength-converter structures 214 are not used in some or all of the LEDs 110, in which case the diffusing elements are provided in the light path between the light emitter arrangement 212 and the optical elements 330.

FIGS. 2A-2B and FIGS. 4-13 are intended to show relative arrangements of the elements therein, and the device assemblies of these figures may include other elements that are not specifically illustrated (e.g., various interfacial layers). Similarly, although particular arrangements of materials are discussed with reference to FIGS. 2A-2B and FIGS. 4-13, intermediate materials may be included in the integrated circuit (IC) devices and assemblies of these figures. Still further, although some elements of the various cross-sectional views are illustrated in FIGS. 2A-2B and FIGS. 4-13 as being planar rectangles or formed of rectangular solids, this is simply for ease of illustration, and embodiments of these assemblies may be curved, rounded, or otherwise irregularly shaped as dictated by, and sometimes inevitable due to, the manufacturing processes used to fabricate such device assemblies.

Example System with a Segmented LED Array with One or More Diffusing Elements

Figure 14:
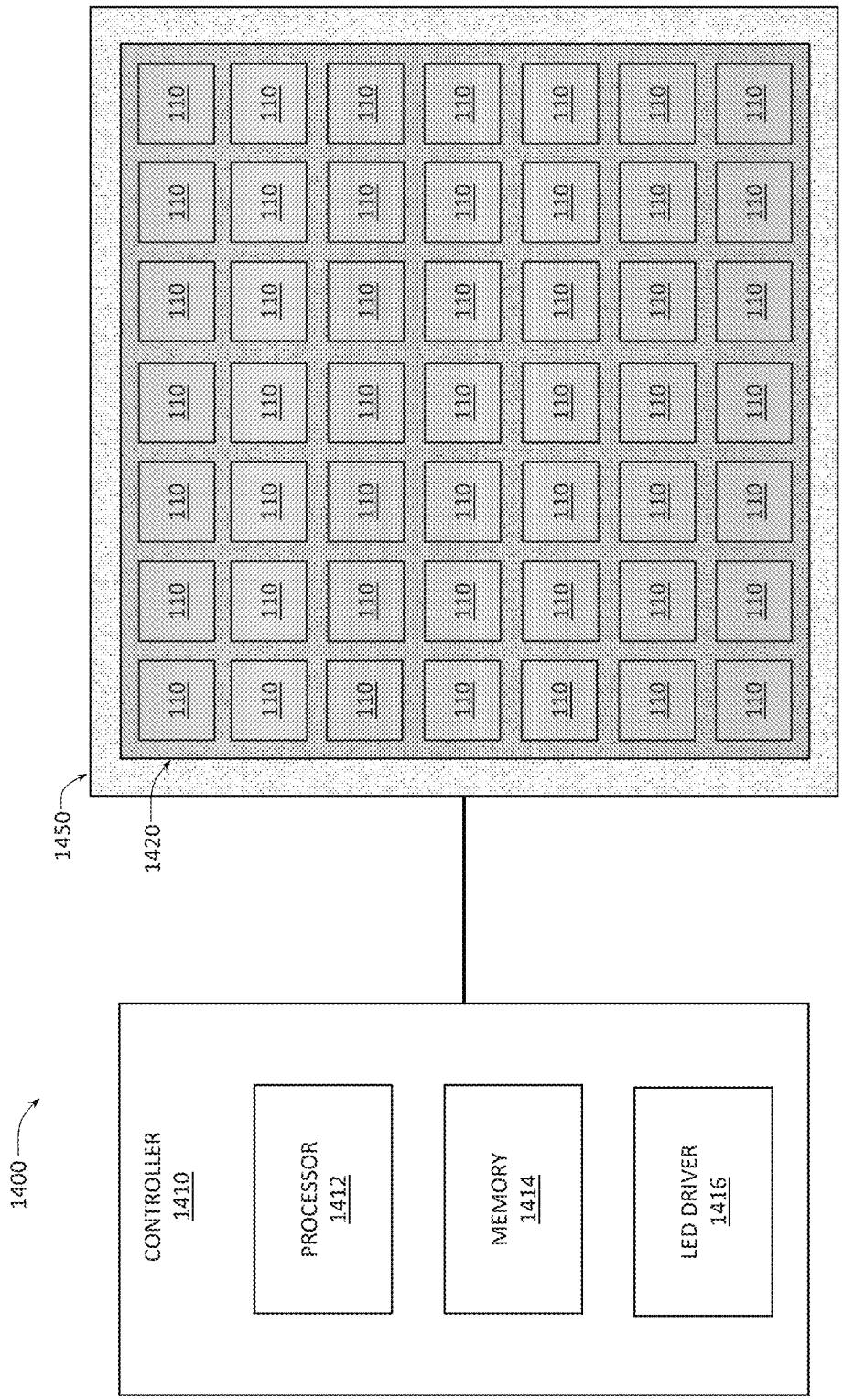
FIG. 14 provides a block diagram illustrating an example system with a light emitter and a controller, according to some embodiments of the present disclosure.

Light emitters with one or more segmented LED arrays with one or more diffusing elements provided in the light path between the light emitter arrangement 212 or the wavelength-converter material and further optics, as described herein, may be included in any suitable system, e.g., in an adaptive lighting system. FIG. 14 provides a block diagram illustrating an example system 1400 with a light emitter 1450 and a controller 1410, according to some embodiments of the present disclosure.

The light emitter 1450 may include an LED array of a plurality of the LEDs 110 as described with reference to FIG. 1, further including a layer 1420 of one or more diffusing elements provided in the light path between the light emitter arrangement 212 or the wavelength-converter material of the LEDs 110 and further optics. For example, the plurality of the LEDs 110 of the light emitter 1450 could be arranged as described with reference to FIG. 3, and the layer 1420 could be implemented as the diffusing segmented LED arrangement 350 described with reference to FIG. 3, some examples of which have been described with reference to FIGS. 4-13.

As shown in FIG. 14, the controller 1410 may include a processor 1412, a memory 1414, and an LED driver 1416.

The processor 1412, e.g. a hardware processor 1412, can execute software or an algorithm to perform the activities as discussed in this specification, in particular activities related to controlling the LEDs 110 of the light emitter 1450. To that end, the processor 1412 may include any combination of hardware, software, or firmware providing programmable logic, including by way of non-limiting example a microprocessor, a digital signal processor (DSP), an application-specific integrated circuit (ASIC) processor, a field-programmable gate array (FPGA), a general-purpose processor (e.g., an ARM-based processor, an x86-based processor, a MIPS processor, etc.), or a virtual machine processor. In some embodiments, the processor 1412 may be communicatively coupled to the memory 1414, for example in a direct-memory access (DMA) configuration, so that the processor 1412 may read from or write to the memory 1414. In some embodiments, the processor 1412 may be coupled to the memory 1414 through a system bus (not shown in FIG. 14). The processor 1412 may be configured to execute program code stored in the memory 1414, e.g., by accessing the program code from the memory 1414 via a system bus.

The memory 1414 may include any suitable type of volatile and non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. The information being measured, processed, tracked or sent to or from any of the components of the system 1400 could be provided in any database, register, control list, cache, or storage structure, all of which can be referenced at any suitable timeframe. Any such storage options may be included within the broad term "memory" as used herein The driver 1416 may include any suitable type of electronic circuit configured to bias and/or supply current to any of the LEDs in the light emitter 1450.

In some implementations, the controller 1410 may configure some of the LEDs in the light emitter 1450 to operate as emitters by applying a forward bias to those LEDs. In some implementations, the controller 1410 may be configured to address each of the LEDs in the light emitter 1450 individually. For example, the controller 1410 may be configured to change the magnitude of the bias of any LED in the light emitter 1450 independently from the rest. As another example, the controller 1410 may be configured to increase or decrease the current supplied to any LED in the light emitter 1450 without changing the supply of current to any of the other LEDs in the light emitter 1450. Although in the present example the controller 1410 is used to control an LED matrix shown to have a single segmented LED chip, alternative implementations are possible in which the controller 1410 is configured to control any suitable type of LED matrix, such as a matrix including multiple segmented LED chips, and/or a matrix including one or more non-segmented LED chips.

Although not specifically shown in FIG. 14, in some embodiments, input/output (I/O) devices can, optionally, be coupled to the controller 1410. Examples of input devices may include, but are not limited to, a keyboard, a pointing device such as a mouse, or the like. Examples of output devices may include, but are not limited to, a monitor or a display, speakers, or the like. In some embodiments, an output device coupled to the controller 1410 may be any type of screen display, such as plasma display, liquid crystal display (LCD), organic light emitting diode (OLED) display, electroluminescent (EL) display, or any other indicator, such as a dial, barometer, or LED. In some implementations, the system 1400 may include a driver (not shown) for the output device. Input and/or output devices may be coupled to the controller 1410 either directly or through intervening I/O controllers. In an embodiment, the input and the output devices may be implemented as a combined input/output device, such as a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

Although also not specifically shown in FIG. 14, in some embodiments, a camera and, optionally, an image processing device, could be coupled to the controller 1410, configured to provide input to the controller 1410. For example, the light emitter 1450 may act as a camera flash while the camera is acquiring an image (which could be one of the frames of a video that the camera is acquiring), then the controller 1410 may analyze the acquired image and adjust the illumination to the scene by adjusting the drive signals provided to the individual LEDS of the light emitter 1450.

Although also not shown in FIG. 14, in some embodiments, a network adapter may also, optionally, be coupled to the controller 1410 to enable it to become coupled to other systems, computer systems, remote network devices, and/or remote storage devices through intervening private or public networks. The network adapter may comprise a data receiver for receiving data that is transmitted by said systems, devices and/or networks to the controller 1410, and a data transmitter for transmitting data from the controller 1410 to said systems, devices and/or networks. Modems, cable modems, and Ethernet cards are examples of different types of network adapter that may be used with the system 1400.

Select Examples

Example 1 provides a light emitter that includes a support structure (e.g., a substrate, a chip, or a die); and a segmented LED array (also referred to as "matrix") including a plurality of LEDs provided over the support structure and, optionally, optically and electrically separated from one another by walls, where the plurality of LEDs are arranged in a plurality of sections (where a given section may include one or more LEDs), each section being aligned with a different respective optical element of a plurality of optical elements. Each LED of the plurality of LEDs includes a light emitter arrangement (and, optionally, a wavelength-converter structure provided over the light emitter arrangement), and a plurality of columns of a diffuser material provided over the light emitter arrangement or the wavelength-converter structure and configured to diffuse light emerging from the light emitter arrangement or the wavelength-converter structure, where the plurality of columns are in a light path between the wavelength-converter structure and at least one of the plurality of optical elements.

Example 2 provides the light emitter according to example 1, where, for at least one LED of the plurality of LEDs, a density of the plurality of columns is higher in a region centered on an optical axis of the LED than in a region farther away from the optical axis of the LED. In other words, the density of columns is higher in the central region of the LED compared to that at the periphery of the LED Example 3 provides the light emitter according to examples 1 or 2, where, for at least one LED of the plurality of LEDs, a width of each of the columns (where, as used herein, the term "width" refers to a dimension measured in a direction in a plane parallel to the support structure) is between about 0.01% and 10% of a width of the LED, e.g. of the width of the light emitter arrangement or the wavelength-converter structure of the LED.

Example 4 provides the light emitter according to any one of the preceding examples, where, for at least one LED of the plurality of LEDs, a height of each of the columns (where, as used herein, the term "height" refers to a dimension measured in a direction perpendicular to the support structure) is between about 0.1 and 500 micrometers, including all values and ranges therein, e.g., between about 50 and 100 micrometers.

Example 5 provides the light emitter according to any one of examples 1-4, where the each LED further includes a layer of the diffuser material between the light emitter arrangement or the wavelength-converter structure and the plurality of columns, the layer of the diffuser material is in contact with the light emitter arrangement or, if used, the wavelength-converter structure, and the plurality of columns are in contact with the layer of the diffuser material.

Example 6 provides the light emitter according to example 5, further including a substantially optically transparent material between the columns, e.g., a material that is at least about 90% transparent to the light emitted from the light emitter arrangement or, if used, the wavelength-converter structure, e.g., silicone.

Example 7 provides the light emitter according to any one of examples 1-4, where the each LED further includes a layer of a substantially optically transparent material between the light emitter arrangement or the wavelength-converter structure and the plurality of columns, e.g., a material that is at least 90% transparent to the light emitted from the light emitter arrangement or the wavelength-converter structure (e.g., silicone), the layer of the substantially optically transparent material is in contact with the light emitter arrangement or the wavelength-converter structure, and the plurality of columns are in contact with the layer of the substantially optically transparent material.

Example 8 provides the light emitter according to example 7, further including the substantially optically transparent material between the columns.

Example 9 provides a light emitter that includes a support structure; and a segmented LED array including a plurality of LEDs provided over the support structure and, optionally, optically and electrically separated from one another by walls, where the plurality of LEDs are arranged in a plurality of sections (where a given section may include one or more LEDs), each section being aligned with a different respective optical element of a plurality of optical elements, and where each LED of the plurality of LEDs includes a light emitter arrangement (and, optionally, a wavelength-converter structure provided over the light emitter arrangement) and a dome-shaped structure of a diffuser material provided over the light emitter arrangement or the wavelength-converter structure, aligned with the LED, and configured to diffuse light emerging from the light emitter arrangement or the wavelength-converter structure, where the dome-shaped structure is in a light path between the light emitter arrangement or the wavelength-converter structure and at least one of the plurality of optical elements.

Example 10 provides the light emitter according to example 9, where, for at least one LED of the plurality of LEDs, the dome-shaped structure has a substantially convex shape with a base of the dome-shaped structure aligned with the light emitter arrangement or the wavelength-converter structure and with a tip of the dome-shaped structure extending away from the light emitter arrangement or the wavelength-converter structure.

Example 11 provides the light emitter according to example 10, where the base of the dome-shaped structure is in contact with the light emitter arrangement or the wavelength-converter structure.

Example 12 provides the light emitter according to examples 10 or 11, where a surface roughness of a portion of the dome-shaped structure extending away from the light emitter arrangement or the wavelength-converter structure (i.e., not the base of the structure) is between about 10 nanometers and 200 micrometers, including all values and ranges therein.

Example 13 provides the light emitter according to example 9, where, for at least one LED of the plurality of LEDs, the dome-shaped structure has a substantially convex shape with a base of the dome-shaped structure being parallel to the light emitter arrangement or the wavelength-converter structure and at a distance from the light emitter arrangement or the wavelength-converter structure, and with a tip of the dome-shaped structure extending away from the base, towards the light emitter arrangement or the wavelength-converter structure.

Example 14 provides the light emitter according to example 13, where a surface roughness of a portion of the dome-shaped structure extending away from the base and towards the light emitter arrangement or the wavelength-converter structure is between about 10 nanometers and 200 micrometers, including ail values and ranges therein. In some embodiments, a layer of a substantially optically transparent material may be included between the light emitter arrangement or the wavelength-converter structure and the dome-shaped structures, e.g., a material that is at least about 90% transparent to the light emitted from the light emitter arrangement or the wavelength-converter structure (e.g., silicone).

Example 15 provides a light emitter that includes a support structure and a segmented LED array including a plurality of LEDs provided over the support structure and, optionally, optically and electrically separated from one another by walls, where the plurality of LEDs are arranged in a plurality of sections (where a given section may include one or more LEDs), each section being aligned with a different respective optical element of a plurality of optical elements, and where each LED of the plurality of LEDs includes a light emitter arrangement, and, optionally, a wavelength-converter structure provided over the light emitter arrangement, and where the light emitter further includes a continuous layer of a diffuser material provided over the light emitter arrangement or the wavelength-converter structure of at least two or more LEDs and configured to diffuse light emerging from the light emitter arrangement or the wavelength-converter structure of the at least two or more LEDs, the diffuser material being in a light path between the light emitter arrangement or the wavelength-converter structure of the at least two or more LEDs and at least one of the plurality of optical elements.

Example 16 provides the light emitter according to example 15, where a surface roughness of the diffuser material is between about 10 nanometers and 200 micrometers, including all values and ranges therein.

Example 17 provides the light emitter according to any one of the preceding examples, further including walls of an optically non-transparent material between each pair of adjacent LEDs.

Example 18 provides the light emitter according to any one of the preceding examples, where the light emitter arrangement includes a first semiconductor layer doped with dopants of a first type, provided over the support structure, an active layer provided over the first semiconductor layer, and a second semiconductor layer doped with dopant of a second type, the second semiconductor layer provided over the active layer.

Example 19 provides the light emitter according to any one of examples 1-18, where at least one of the plurality of optical elements includes an aperture configured to guide light that is incident on the optical element from the optical element's central direction while absorbing light that is incident on the optical element from another direction.

Example 20 provides the light emitter according to any one of examples 1-18, where at least one of the plurality of optical elements includes a lens.

Example 21 provides an electronic device that includes a controller that includes an LED driver and a light emitter that includes a plurality of LEDs, where the LED driver is configured to drive the plurality of LEDs, and where the light emitter is a light emitter according to any one of the preceding examples.

Example 22 provides the electronic device according to example 21, where the controller further includes a processor and a memory.

Example 23 provides the electronic device according to examples 21 or 22, where the electronic device is a camera device that includes a camera, and where the light emitter is a flash for the camera.

Example 24 provides the electronic device according to any one of examples 21-23, where the electronic device is a wearable electronic device (e.g., a smart watch) or a handheld electronic device (e.g., a mobile phone).

The invention claimed is:

1. An apparatus comprising:
   an array of multiple light emitting elements arranged so as to emit array output light, the light emitting elements of the array being separated from one another by trenches filled with non-transparent material or with walls;
   one or more optical elements arranged so as to direct at least a portion of the array output light to form an image of the array; and
   one or more optical diffusers positioned in a light path between two or more light emitting elements of the array and one or more of the optical elements, the one or more optical diffusers being arranged so as to eliminate, in the image of the array, appearance of the trenches or walls.

2. The apparatus of claim 1, surface roughness of one or more surfaces of the one or more optical diffusers, that face away from the light emitting elements of the array, being between 10 nanometers and 200 micrometers.

3. The apparatus of claim 1 further comprising a layer of transparent material positioned in the light path between the array of light emitting elements and the one or more optical diffusers.

4. The apparatus of claim 1, the one or more optical diffusers including a continuous layer of optical diffuser material extending across multiple light emitting elements of the array.

5. The apparatus of claim 4, the continuous layer of optical diffuser material being substantially flat.

6. The apparatus of claim 4, the continuous layer of optical diffuser material having an irregular rough surface.

7. The apparatus of claim 4, the continuous layer of optical diffuser material having a periodic rough surface including periodic shapes on a surface thereof.

8. The apparatus of claim 4 further comprising non-transparent walls that extending partly into the continuous layer of optical diffuser material.

9. The apparatus of claim 1, the one or more optical diffusers including multiple dome-shaped volumes of diffuser material, each dome-shaped volume being positioned over a corresponding light emitting element of the array.

10. The apparatus of claim 9, a convex portion of each dome-shaped volume facing the corresponding light emitting element.

11. The apparatus of claim 9, a convex portion of each dome-shaped volume extending away from the corresponding light emitting element.

12. The apparatus of claim 1, the one or more optical diffusers including multiple pluralities of columns of diffuser material, each plurality of columns being positioned over a corresponding light emitting element of the array.

13. The apparatus of claim 12 wherein, for at least one light emitting element, (i) a width of each of the columns is between 0.01% and 10% of a width of the corresponding light emitting element, or (ii) a height of each of the columns is between 0.1 and 500 micrometers.

14. The apparatus of claim 12, a density of each plurality of columns being higher in a region centered around an optical axis of the corresponding light emitting element than in a region farther away from that optical axis.

15. The apparatus of claim 12, the one or more optical diffusers further comprising a continuous layer of diffuser material in contact with the pluralities of columns and positioned either (i) between the pluralities of columns and the light emitting elements of the array or (ii) with the pluralities of columns between the continuous layer of diffuser material and the light emitting elements of the array.

16. The apparatus of claim 12 further comprising substantially optically transparent material between the columns.

17. The apparatus of claim 1, each light emitting element including multiple semiconductor layers arranged as a light emitting diode (LED) with an active layer between a first semiconductor layer doped with dopants of a first type and a second semiconductor layer doped with dopants of a second type.

18. The apparatus of claim 1 further comprising one or more wavelength converter structures positioned in the light path between multiple light emitting elements of the array and the one or more optical diffusers.

19. The apparatus of claim 1, the one or more optical elements including (i) one or more apertures arranged so as to guide array output light incident on the one or more apertures, or (ii) one or more lenses.

* * * * *